US011139142B2

(12) United States Patent
Yuli et al.

(10) Patent No.: US 11,139,142 B2
(45) Date of Patent: Oct. 5, 2021

(54) HIGH-RESOLUTION THREE-DIMENSIONAL PROFILING OF FEATURES IN ADVANCED SEMICONDUCTOR DEVICES IN A NON-DESTRUCTIVE MANNER USING ELECTRON BEAM SCANNING ELECTRON MICROSCOPY

(71) Applicant: Applied Materials, Inc., Santa Clara, CA (US)

(72) Inventors: Ofer Yuli, Sunnyvale, CA (US); Samer Banna, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 30 days.

(21) Appl. No.: 16/421,268

(22) Filed: May 23, 2019

(65) Prior Publication Data

US 2020/0373120 A1    Nov. 26, 2020

(51) Int. Cl.
*H01J 37/22* (2006.01)
*H01J 37/28* (2006.01)
*H01L 21/66* (2006.01)

(52) U.S. Cl.
CPC ............ *H01J 37/222* (2013.01); *H01J 37/28* (2013.01); *H01L 22/20* (2013.01); *H01J 2237/221* (2013.01); *H01J 2237/2815* (2013.01)

(58) Field of Classification Search
CPC .... H01J 37/222; H01J 37/28; H01J 2237/221; H01J 2237/2815; H01J 2237/0048; H01J 37/265; H01J 2237/281; H01J 2237/24485; H01L 22/20; H01L 22/12; G01B 15/04
See application file for complete search history.

(56) References Cited

U.S. PATENT DOCUMENTS

| 5,757,502 | A | 5/1998 | Weling |
| 6,646,262 | B1 | 11/2003 | Todokoro et al. |
| 7,473,911 | B2 * | 1/2009 | Kadyshevitch ... H01J 37/32935 250/492.22 |
| 8,110,799 | B2 | 2/2012 | Adler |

(Continued)

OTHER PUBLICATIONS

Abe et al., "Error Factor in Bottom CD Measurement for Contact Hole using CD-SEM," Metrology, Inspection, and Process Control for Microlithography XX, SPIE, 9 pages, vol. 6152.
Bizen et al., "High-precision CD measurement using energy-filtering SEM techniques," J. Micro/Nanolith. MEMS MOEMS, 2017, 6 pages, vol. 16(2).
Cepler et al., "Scanning electron microscopy imaging of ultra-high aspect ratio hole features," Metrology, Inspection, and Process Control for Microlithography XXVI, SPIE, Apr. 5, 2012, 16 pages, vol. 8324.

(Continued)

*Primary Examiner* — Benjamin Tzu-Hung Liu
(74) *Attorney, Agent, or Firm* — Lowenstein Sandler LLP

(57) ABSTRACT

A plurality of energy filter values are obtained using a model that simulates potential distribution within a 3D feature when an electron beam of an SEM impinges on a selected area that includes the 3D feature. A correspondence is extracted between the plurality of energy filter values and respective depths of the 3D feature along a longitudinal direction by analyzing the simulated potential distribution. A plurality of SEM images of the 3D feature corresponding to the plurality of energy filter values are obtained. The plurality of SEM images are associated with their respective depths based on the extracted correspondence between the plurality of energy filter values and the respective depths. A composite 3D profile of the 3D feature is generated from the plurality of SEM images obtained from various depths of the 3D feature.

20 Claims, 7 Drawing Sheets

(56) References Cited

U.S. PATENT DOCUMENTS

| | | | |
|---|---|---|---|
| 9,318,299 B2 | 4/2016 | Sasaki et al. | |
| 2008/0265160 A1* | 10/2008 | Ojima | G01N 23/04 |
| | | | 250/311 |
| 2013/0166240 A1* | 6/2013 | Shishido | G01Q 40/00 |
| | | | 702/97 |
| 2013/0200255 A1* | 8/2013 | Schwarzband | H01J 37/24 |
| | | | 250/252.1 |
| 2013/0248705 A1 | 9/2013 | Hayashi | |
| 2013/0292568 A1 | 11/2013 | Bizen et al. | |
| 2014/0367586 A1 | 12/2014 | Frosien et al. | |
| 2016/0379798 A1* | 12/2016 | Shishido | H01J 37/244 |
| | | | 250/307 |
| 2018/0182595 A1* | 6/2018 | Yokosuka | G03F 7/70625 |
| 2019/0378683 A1 | 12/2019 | Chirko et al. | |

OTHER PUBLICATIONS

Grella et al., "Three Dimensional Simulations of SEM Imaging and Charging," Metrology, Inspection, and Process Control for Microlithography XV, SPIE, 2001, 8 pages, vol. 4344.

Kang et al., "Methodology and mechanism Study on High Aspect Ratio (HAR) contact bottom image in Scanning Electron Microscopy," Metrology, Inspection, and Process Control for Microlithography XIX, SPIE, 2005, 8 pages, vol. 5752.

Ose et al., Improved CD-SEM optics with retarding and boosting electric fields, Metrology, Inspection, and Process Control for Microlithography XIII, Jun. 14, 1999, 11 pages, vol. 3677.

\* cited by examiner

HIGH-RESOLUTION THREE-DIMENSIONAL PROFILING OF FEATURES IN ADVANCED SEMICONDUCTOR DEVICES IN A NON-DESTRUCTIVE MANNER USING ELECTRON BEAM SCANNING ELECTRON MICROSCOPY

TECHNICAL FIELD

Embodiments of the disclosure relate generally to imaging of fine features on a semiconductor wafer using precision three-dimensional profiles derived from scanning electron microscopy (SEM).

BACKGROUND

The manufacturing process of semiconductor integrated circuits requires high resolution metrology measurements. Profiles of three-dimensional (3D) structures with various aspect ratios, including, high aspect ratio structures, need to be accurately characterized along the longitudinal direction (z-axis) for effective process optimization and control. So far, full profile characterization has been done mainly by destructive imaging techniques like inspecting longitudinal cross section under Scanning Electron Microscope (x-SEM) or Transmission Electron Microscope (TEM), which are useful for accurately revealing the real 3D profile of shallow or deep structures, but the information gathered is limited to small regions (very low statistics) on the wafer and sample preparation can be time consuming. Moreover, the measurement is prone to variability due to the semi-manual sample preparation.

Here a method is proposed for obtaining 3D profiles of high, mid and low aspect ratio semiconductor structures using electron beam (e-beam) imaging. The non-destructive nature of e-beam imaging allows profiling analysis to be done on a large scale (i.e., massive measurements), providing a statistical overview of the entire wafer. In addition, e-beam profiling can be used in-line without destroying the wafer to get access to longitudinal cross-section, as done conventionally in x-SEM and TEM. This non-destructive approach improves the throughput and optimize cost as it is feasible to integrate with the rest of wafer processing in a production line.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

The technique disclosed here obtains a series of two-dimensional (2D) SEM-based planar geometrical profile images (obtained at an optimized working point—e.g. electrons landing energy, frame rate, etc.) at various depths obtained by applying different energy filter values. A method is developed to determine the potential distribution inside the structure that allows converting each energy filter value to depth. Each image therefore, represents a 2D cross sectional contour at a certain depth in which the dimensions of interest, including critical dimensions (CDs) of a feature can be recorded (e.g., radii, diameter, lateral CD, etc.). The 2D images are then used to produce a composite 3D profile of the structure along the longitudinal z axis.

Specifically, the disclosure describes a method and a corresponding system for: selecting an area of a semiconductor device to be scanned by a scanning electron microscope (SEM), wherein the area includes a three-dimensional (3D) feature having a finite depth; obtaining a plurality of energy filter values using a model that simulates potential distribution within the 3D feature when an electron beam of the SEM impinges on the selected area including the 3D feature; extracting a correspondence between the plurality of energy filter values and respective depths of the 3D feature along a longitudinal direction by analyzing the simulated potential distribution; applying the plurality of energy filter values to the SEM; obtaining a plurality of SEM images of the 3D feature corresponding to the plurality of energy filter values; associating the plurality of SEM images with their respective depths based on the extracted correspondence between the plurality of energy filter values and the respective depths; and, generating a composite 3D profile of the 3D feature from the plurality of SEM images obtained from various depths of the 3D feature.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
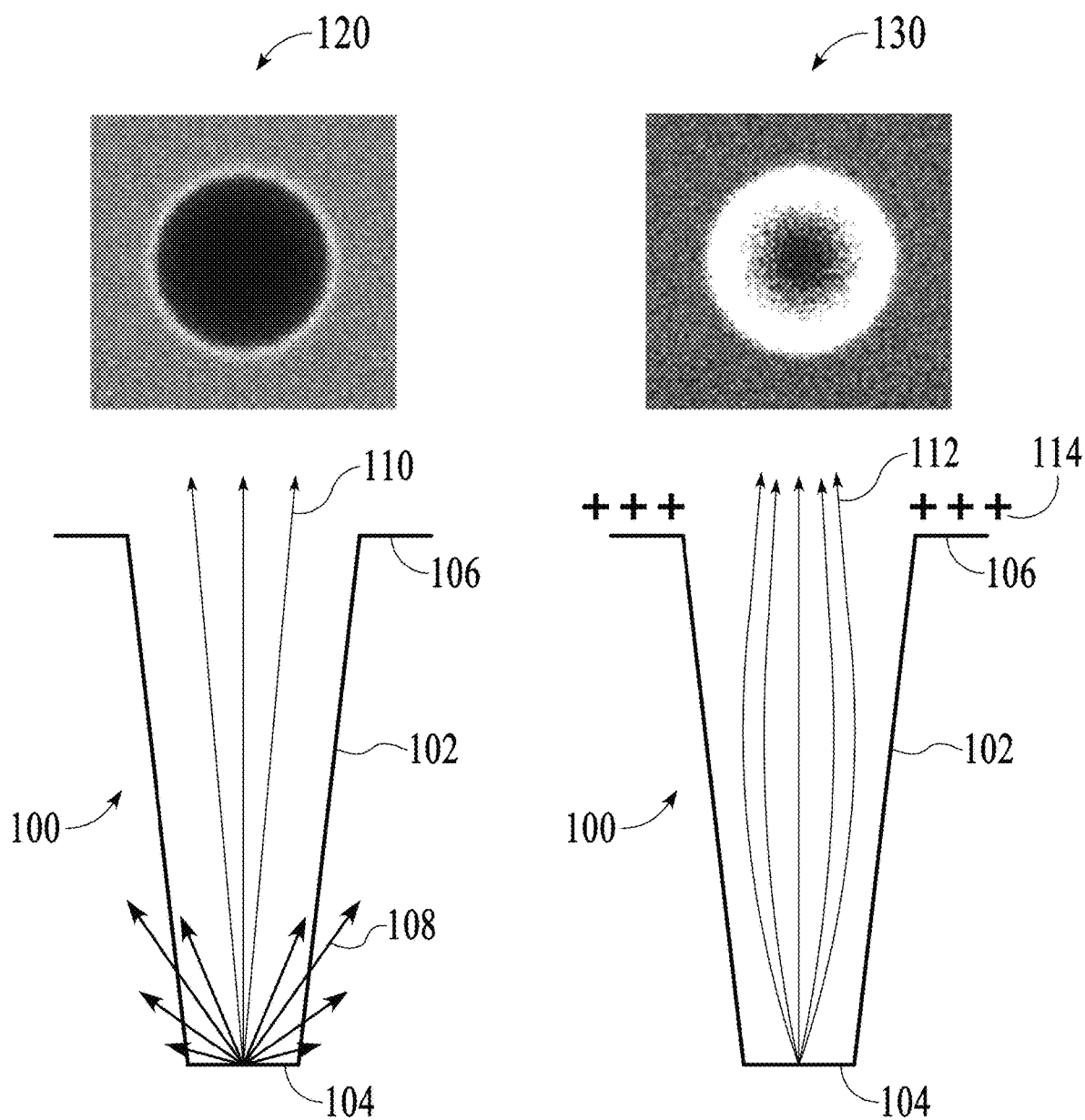
FIG. 1 illustrates how electrons from 3D deep structures can be extracted using a voltage difference between a bottom surface and a top surface of the structure.

Embodiments of the present disclosure are directed to novel, high-resolution techniques to construct three-dimensional profiles of characteristic 3D features of electronic devices in a non-destructive way using Scanning Electron Microscope (SEM) images obtained at different energy filter values that are computed by a model that simulates a potential distribution within the 3D feature and extracts a correspondence between the energy filter values and respective depths of the 3D feature. The electronic devices may be advanced semiconductor devices formed on a wafer. Some semiconductor devices may have structures with high aspect ratio (HAR). For example, HAR structures that are routinely used in current and next generation semiconductor devices, display devices, photovoltaic devices, micro-electro-mechanical systems (MEMS) devices, etc. usually have aspect ratio greater than 1:10, and more typically, in the range of 1:40 to 1:200. This disclosure is, however, not limited to any specific aspect ratio and is equally applicable for low and medium aspect ratio structures as well. Illustrative examples of HAR structures include, but are not limited to, channel holes, slits, trenches etc. Specific examples include memory holes in 3D NAND memory devices. Imaging and metrology of a circular memory hole is described in detail in this specification to illustrate the inventive concepts, although those skilled in the art can extrapolate the application of the disclosed technique to other geometries. Examples of other geometries include trenches such as those used for shallow trench isolation of transistors.

Irrespective of aspect ratio, 3D device features should be characterized well using detailed metrology to be able to tune process parameters as a process (such as an etching process or a deposition process) progresses and the aspect ratio of the structures changes. For example, in an etch process, the etch rate varies as the aspect ratio of a feature changes with time. Accurate characterization of device features enables effective tuning of the etch process parameters. Current approaches for device feature characterization use SEM images along a vertical (or longitudinal) section, and/or transmission electron microscopy (TEM) images. These imaging techniques usually provide only an image of a single planar section from which a limited number of device characterization metrics are obtained.

The present method performs normal top down imaging, and extracts two-dimensional (2D) planar geometrical profiles (e.g., a circle) at different heights/depths of a device feature (either from an isolated structure or an array of structures). 2D planar geometrical profiles at different heights/depths are then plotted against their corresponding depths to reconstruct one composite 3D profile of the device feature. The critical dimension (CD) at each depth can be recorded in order to characterize a process, such than an etching or cleaning process. Examples of CD may include radius or diameter if the feature is circular. Other dimensions or properties of interest, such as, taper, tilt, notch, symmetry, ellipticity, line width roughness (LWR), line edge roughness (LER) etc. may also be recorded. Additionally or alternatively, the reconstructed profile may be used for defect review.

Advantages of the current method include, but are not limited to: (1) non-destructive technique that can be easily integrated in the manufacturing process sequence; (2) cost-efficient; (3) full-wafer coverage of 3D profiling for low, medium and high aspect ratio features/structures; (4) higher accuracy and automation of measurements.

FIG. 1 illustrates how electrons from 3D deep structures can be extracted using a voltage difference between a bottom surface and a top surface of the structure. The 3D deep structure 100 shown in FIG. 1 can be a memory hole, a trench or some other structure that has a top surface 106, a bottom surface 104 and a sidewall 102 connecting the top and the bottom surfaces. The sidewall 102 mat be completely vertical in an idea case, but may have some sidewall tilt, as shown in FIG. 1 (not to scale though) by design or induced by process variation. As shown in the left hand side of FIG. 1, in the absence of an electric field, a vast majority of secondary electrons 108 emitting from the bottom surface may not reach a detector place above the structure 100, while a few secondary electrons 110 do reach the detector. Overall, the signal received from the bottom surface 104 is much weaker than the signal received from the top surface 106. Therefore, the resulting SEM image of the structure 100 may look like image 120. However, if due to an electric field, a voltage difference is created between the top and bottom surfaces, a lot more secondary electrons 112 from the bottom surface will reach the detector, as shown in the right hand side of FIG. 1. The resulting SEM image of the structure 100 may look like image 130 when the electric field is applied. Note that, at least a part of the structure 100 need to be non-conductive in order to create and maintain a potential different between the top and the bottom surfaces. For example, the top surface 106 may be at a finite voltage 'V' (shown by the positive charge signs 114), while the bottom surface may be at a 'zero' voltage. Note that 'zero' voltage does not necessarily mean it is at the numerical value 'zero', but merely means that the voltage difference between the top surface and the bottom surface is 'V,' as shown in FIG. 2.

Figure 2:
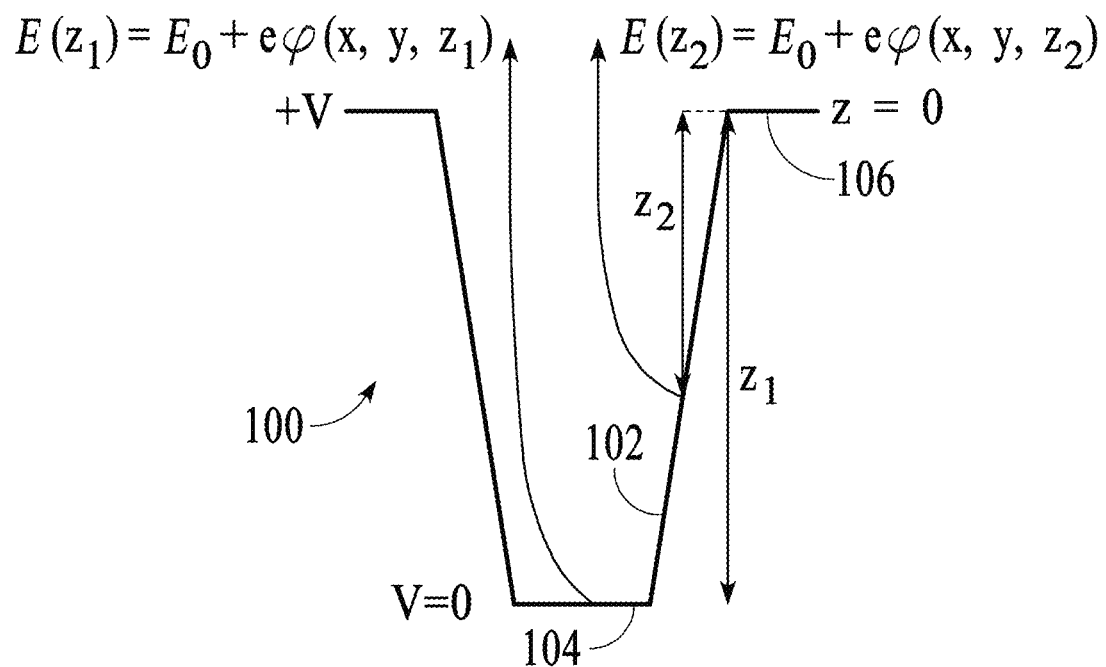
FIG. 2 illustrates a potential distribution within a 3D deep structure, where energy of the detected electron is offset from the secondary electron energy distribution by the potential according to the location of the emittance of the secondary electron.

FIG. 2 illustrates a potential distribution within a 3D deep structure. The potential distribution may be created by pre-charging the area that includes the 3D deep structure. Pre-charge is a technique that sets a potential difference between the top and the bottom surfaces of a deep structure, at least part of which is non-conductive to maintain the potential difference. The resulting electrical field accelerates the electrons from inside the deep structure towards the e-beam detectors, thus increasing the signal from within the deep structure.

Pre-charging also creates a differentiation between electrons emitted from within the deep structure—the deeper the emittance location is, the larger the potential difference it will experience. As a result the energy spectrum of the emitted electrons is shifted by an offset that is proportional to the depth of their emittance location.

Using an energy filter, the change in the energy of the detected electrons can be monitored and converted to the depth from which the electrons originated. Each image represents a 2D cross-sectional geometrical profile at the depth associated with the energy filter value. The relevant dimension of interest (e.g., diameter of a circular 2D cross-sectional image) can be measured and combined sequentially to reconstruct a 3D profile of the inner walls of the deep structure.

A specific field of view (FOV) may be pre-charged, or a high magnification FOV may be enough to generate the required charge to create the potential distribution. The magnification, dose, and pixel size may be varied to reach maximal charging voltage. Charging is material-dependent, so parameters of charging depend on the particular wafer. The landing energy of the primary beam may be between 50-3000V, depending on the material of the wafer and the 3D deep structure being inspected. Note that if pre-charge is used as a separate step, imaging setting in the pre-charge step is not necessarily the setting used for the final imaging. In the pre-charge stage, the objective is to create enough positive voltage difference between the top and the bottom surfaces of the deep structure. Final imaging mode is set to achieve best resolution, contrast and signal-to-noise ratio (SNR) rather than to achieve sufficient voltage difference. In the final imaging step, an energy filter is set to a value where all secondary electrons including those accelerated in the deep structure. For example, if the charging voltage is V, energy filter (EF) can be set as: $EF=-1.2*V$. This ensures that all electrons emitted from within the deep structure are blocked. SEM images are obtained at various energy filter values, for example EF values that may be ramped in steps of 1V, 5V, or 10V or any other predetermined ramping step.

The step value is set to optimize the z-resolution. If required, before every SEM image grab, a pre-charge condition can be set. This may be particularly useful, for example, when charging is not stable because of the inherent characteristics of the wafer.

Converting the energy filter value to depth requires knowing how the potential is distributed along the surface of the structure. A model is capable of simulating potential distribution within the deep structure based on the following methodology. The model is based on the fact that if E0 is the regular secondary electron energy distribution, then with charging, the energy of the detected electron is offset from the secondary electron energy distribution by the potential $\varphi(x,y,z)$ according to the location (i.e., the x, y, z coordinates) of the emittance of the secondary electron. For example, if the top surface 106 is assumed to have z=0, and the bottom surface 104 is assumed to have z=z1, then the energy E(z1) associated with the electrons emitted from the bottom surface 104 would be, $E(z1)=E0+e\varphi(x,y,z_1)$, where 'e' indicates the electron's charge. Similarly, the energy E(z2) associated with the electrons emitted from the sidewall 102 at a depth z2 would be $E(z2)=E0+e\varphi(x,y,z_2)$. Note that E(z2)<E(z1), and $V=\varphi(x,y,z_1)-(x,y,0)$. In general, the energy offset is expressed as the following: $\Delta E=e\varphi(x,y,z)-e\varphi(x,y,0)$, where z=0 is the top surface of the deep structure.

Figure 3:
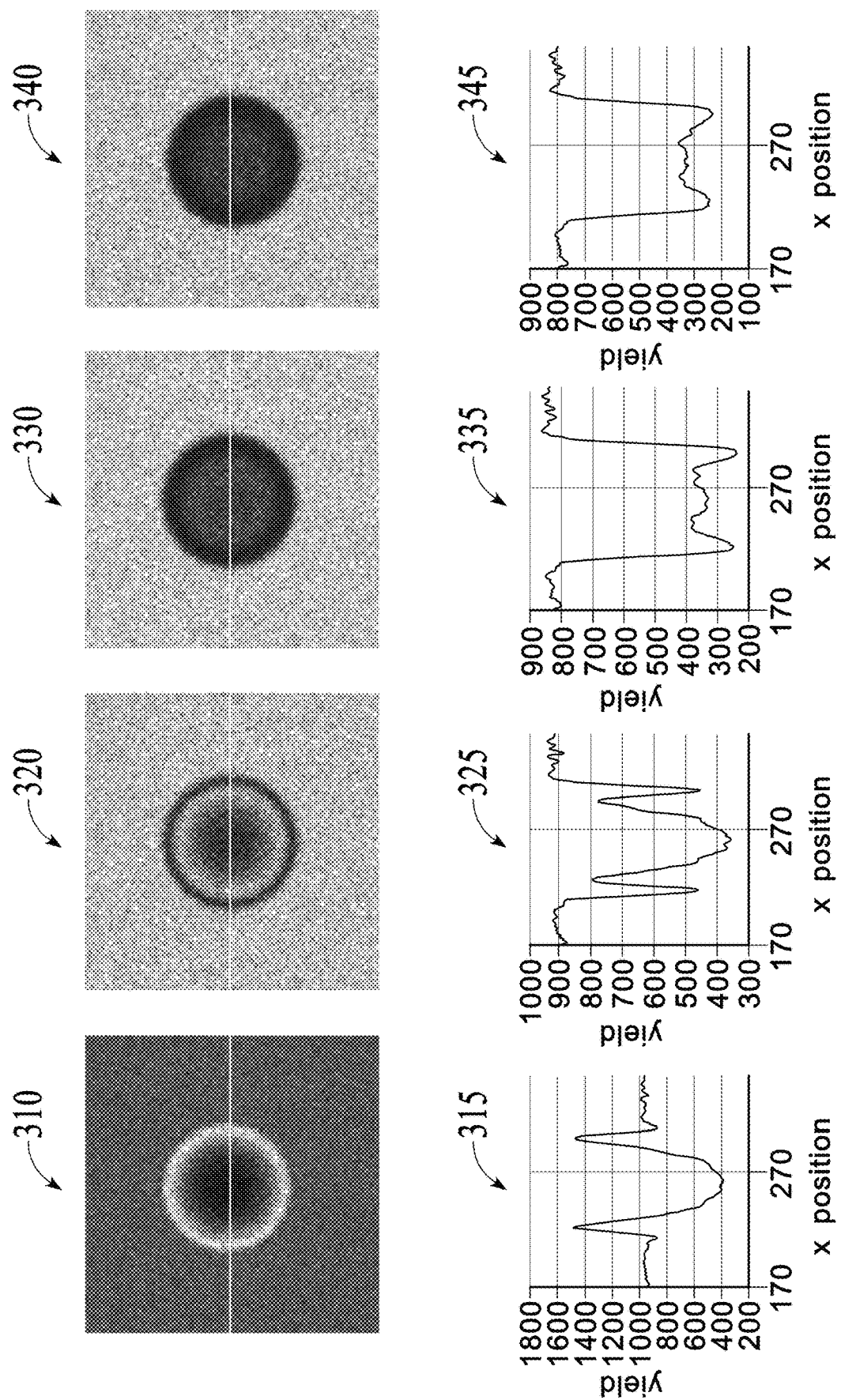
FIG. 3 illustrates waveforms obtained from a model that simulates radial profiles of a 3D deep structure at various depths.

There are several options to determine the potential distribution $\varphi(x,y,z)$. One option is finding the best fit to simulated waveforms, such as waveforms 315, 325, 335 and 345 shown in FIG. 3. A linearly distributed potential may be assumed along the z axis at various charging values. The simulated EF corresponds to a certain depth. Measured waveforms ($EF_{measured}$) are fitted to a simulated waveform ($EF_{simulated}$). Usually, $EF_{measured}$ values are not equal to the corresponding $EF_{simulated}$. The $EF_{measured}$ is converted to depth to reconstruct the potential distribution within the structure. In FIG. 3, images 310, 320, 330 and 340 are simulated 2D geometric profiles of the structure for various EF values corresponding to various depths. A critical dimension (i.e. diameter) is determined by the peaks of the waveforms, wherein the waveforms are dependent on the energy filter value.

The second option is assuming various other non-linear potential distributions (e.g. quadratic in z, logarithmic, etc.). The distribution in which the waveforms of the measured EF and the simulated EF match is then taken as the actual potential distribution within the structure. Note that this method does not vary the energy filter value.

A third option is comparison with xSEM/TEM images using best fit methodology, where the correlation function between the energy bands and longitudinal cross section from xSEM/TEM is used to determine the actual potential distribution. This procedure produces 2D cross section of the x-z plane. Rotating the scanning direction by 90 degree provides the y-z cross section. A full 3D profile reconstruction would require multiple scanning rotations. Embodiments of the present disclosure provide a better solution than this third option.

Figure 4A:
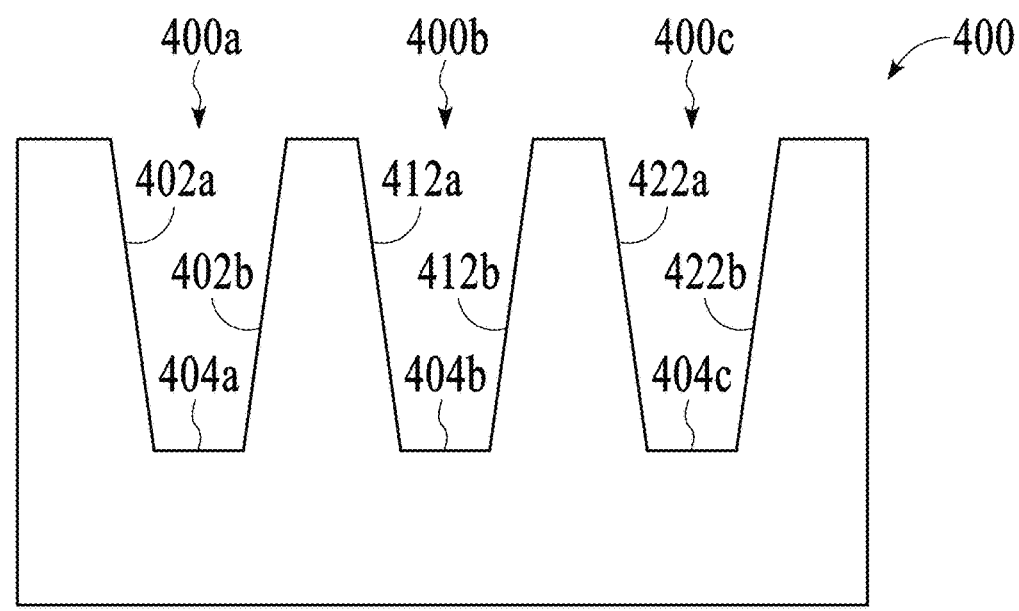
FIG. 4A illustrates an array of the 3D deep structures disposed along a lateral direction.

FIG. 4A shows an array with three consecutive deep structures 400a, 400b and 400c disposed side by side to be line scanned. The structure 400a has sidewalls 402a and 402b and a bottom surface 404a. The structure 400b has sidewalls 412a and 412b and a bottom surface 404b. The structure 400c has sidewalls 422a and 422b and a bottom surface 404c.

Figure 4C:
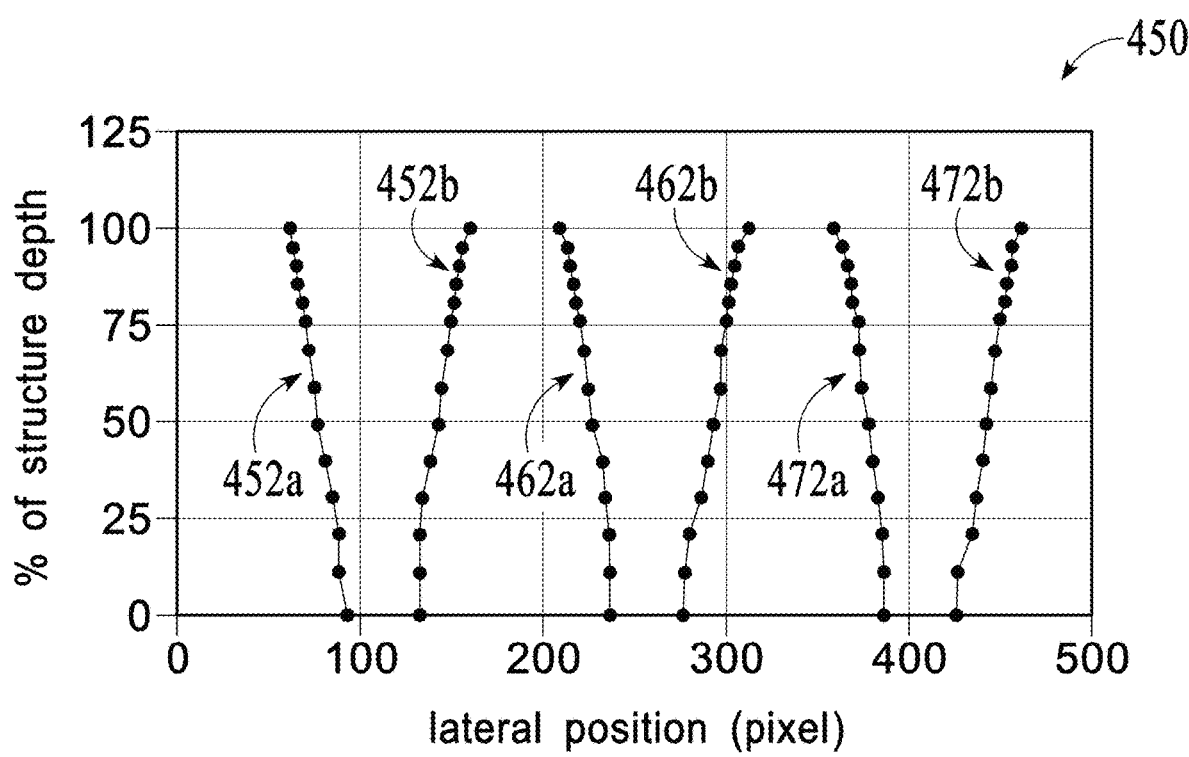
FIG. 4C illustrates reconstruction of the profile of the lateral array of the 3D deep structures from the waveforms in FIG. 4B.

FIG. 4C illustrates how the sidewalls of the array shown in FIG. 4A are reconstructed and plotted as plot 450 using simulated waveforms (such as the waveforms shown in FIG. 4B) corresponding to various energy filter values suggested by the model that predicts potential distribution within the deep strictures in the array, as described above. Plots 452a and 452b denote the sidewalls of the structure 400a, plots 462a and 462b denote the sidewalls of the structure 400b, and plots 472a and 472b denote the sidewalls of the structure 400c. Note that the depth values extracted from the corresponding energy filter values are plotted along the lateral position along the x-axis in FIG. 4C. The lateral positions are the coordinates along a scanning line such as line 551 shown in the image 550 in FIG. 5.

Figure 4B:
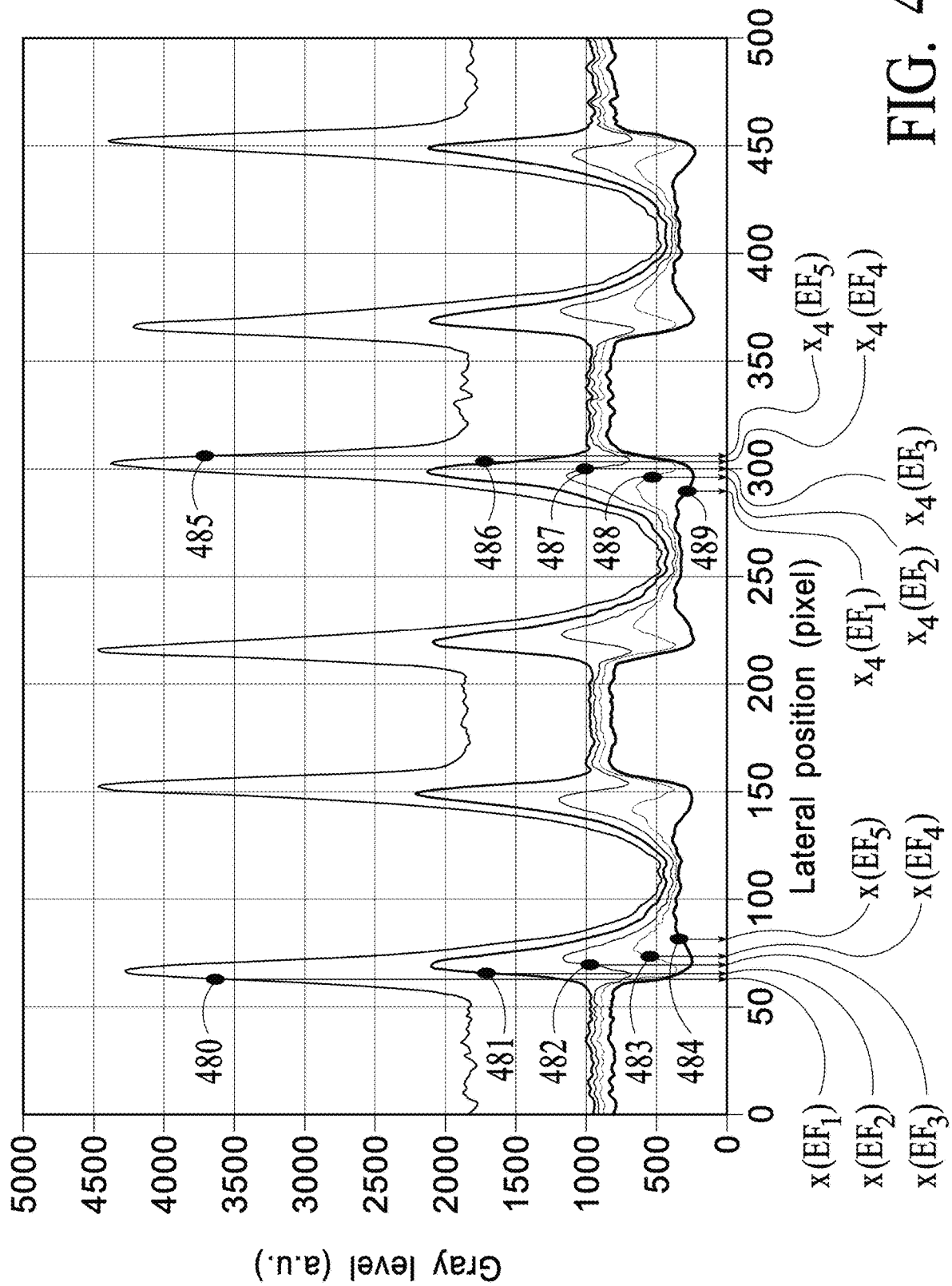
FIG. 4B illustrates waveforms corresponding to the lateral array of 3D deep structure at different energy filter values.

FIG. 4B shows typical line scans of SEM images of the structure shown in FIG. 4A. In FIG. 4B, the x-axis is the lateral coordinate (e.g., x coordinate along the scanning line), and the y axis is the gray level in an arbitrary unit (a.u). Gray level represents the brightness of a pixel along the scanning line. FIG. 4B shows examples of five waveforms corresponding to five different energy filter values, EF1, EF2, EF3, EF4 and EF5. Note that, just five waveforms are shown for clarity, while many more waveforms are generated when the EF value is ramped up in predetermined steps. The position of the sidewall is indicated by the peak in gray level. For example, the point 480 at a peak in gray level for EF1 denotes sidewall position of structure 400a at the depth associated with EF1. Similarly, the point 481 at a peak in gray level for EF2 denotes sidewall 402a position at the depth associated with EF2, the point 482 at a peak in gray level for EF3 denotes sidewall position at the depth associated with EF3, the point 483 at a peak in gray level for EF4 denotes sidewall position at the depth associated with EF4, and the point 484 at a peak in gray level for EF1 denotes sidewall position at the depth associated with EF5. For structure 400b, the points 485-489 denote the sidewall 412b position for EF values EF1-EF5.

Figure 5:
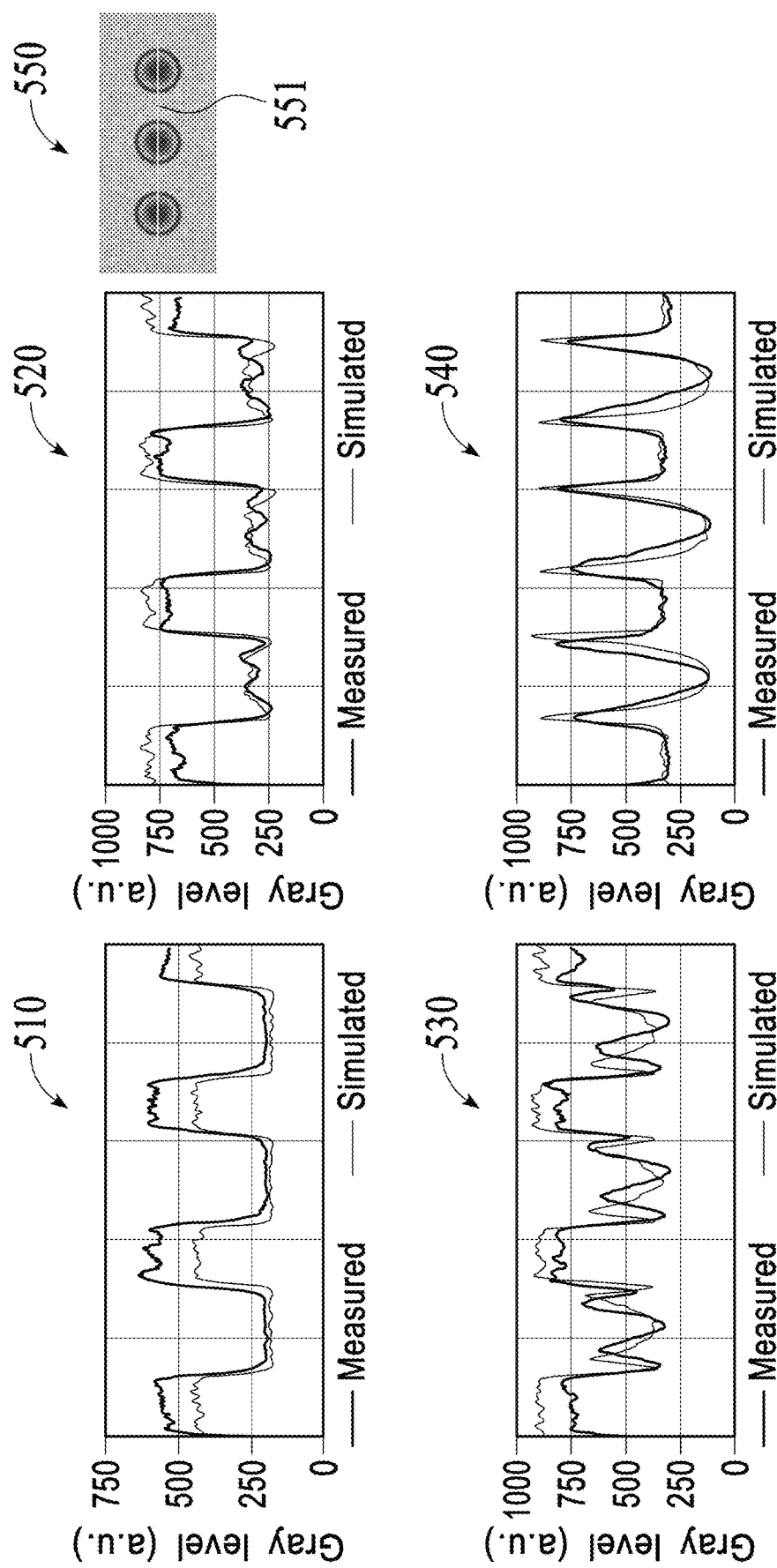
FIG. 5 compares simulated line scans with measured line scans of an array of 3D deep structures.

FIG. 5 compares simulated line scans with measured line scans of an array of 3D deep structures. In FIG. 5, the x-axis is the lateral coordinate (e.g., x coordinate along the scanning line), and the y axis is the gray level in an arbitrary unit (a.u). The gray levels represent the corresponding brightness of a pixel along a line scan as shown in the image 550 showing top view (2D geometrical profile) of an array of three deep structures disposed side by side, as shown in FIG. 4A. In FIG. 5, the thicker lines depict measured values of the brightness and the thinner lines plots the simulated value of the brightness. Plot 510 corresponds to a high value of energy filter generating a measured waveform associated with the bottom surface of the structure, while plot 540 corresponds to a low value of energy filter generating a measured waveform associated with the top surface of the structure. Plots 520 and 530 respectively correspond to a medium-strong and medium-weak values of energy filter, generating waveforms from the lower part and the higher part, respectively, of the structure. As shown, the simulated waveforms are not identical to the measured waveforms, but come quite close. The measured waveforms are used to improve the model that simulates potential distribution within the structure so that the model can predict energy filter values to be applied in the next measurement more accurately. By comparing the simulated energy filter values with the measured ones, the correlation function between the real potential value and the simulated value can be defined. Since the potential distribution of the simulation is known, one can assign a depth to each corresponding energy filter value used in the simulation.

Note that frame registration algorithms may be required to be performed on the entire series of actual SEM images since pre-charging can lead to drifts of the primary beam during the actual imaging process. Failing to register the images of the same location (e.g., the same x-coordinate along the scanning line) with varying EF values may introduce an error in the 3D profile. Algorithm for frame registration may preferably be based on inherent symmetry of the deep structure being scanned, i.e. the position of the deep structure's center (if it is an isolated structure), or the center point between adjacent structures (if it is an array of structures, as shown in FIG. 4A). Using edge based frame registration algorithms rather than center-based frame registration algorithms may lead to poorer results since the edges are generally expected to shift between frames, while the center points tend to be at the same location.

For reconstructing the 3D profile from the 2D SEM images, a depth value (z-position) corresponding the applied energy filter value is assigned to each of the 2D SEM images representing a planar geometrical contour in the x-y plane at a certain depth. Then all the 2D SEM images are plotted vs. the z-position to create the composite 3D profile. This disclosure allows reconstruction of the 3D profile using SEM images in a non-destructive manner, therefore easier to integrate with the manufacturing sequence. Moreover, large-scale device characterization and metrology can be performed across the entire wafer to fine-tune the process without disrupting the manufacturing flow.

Figure 6:
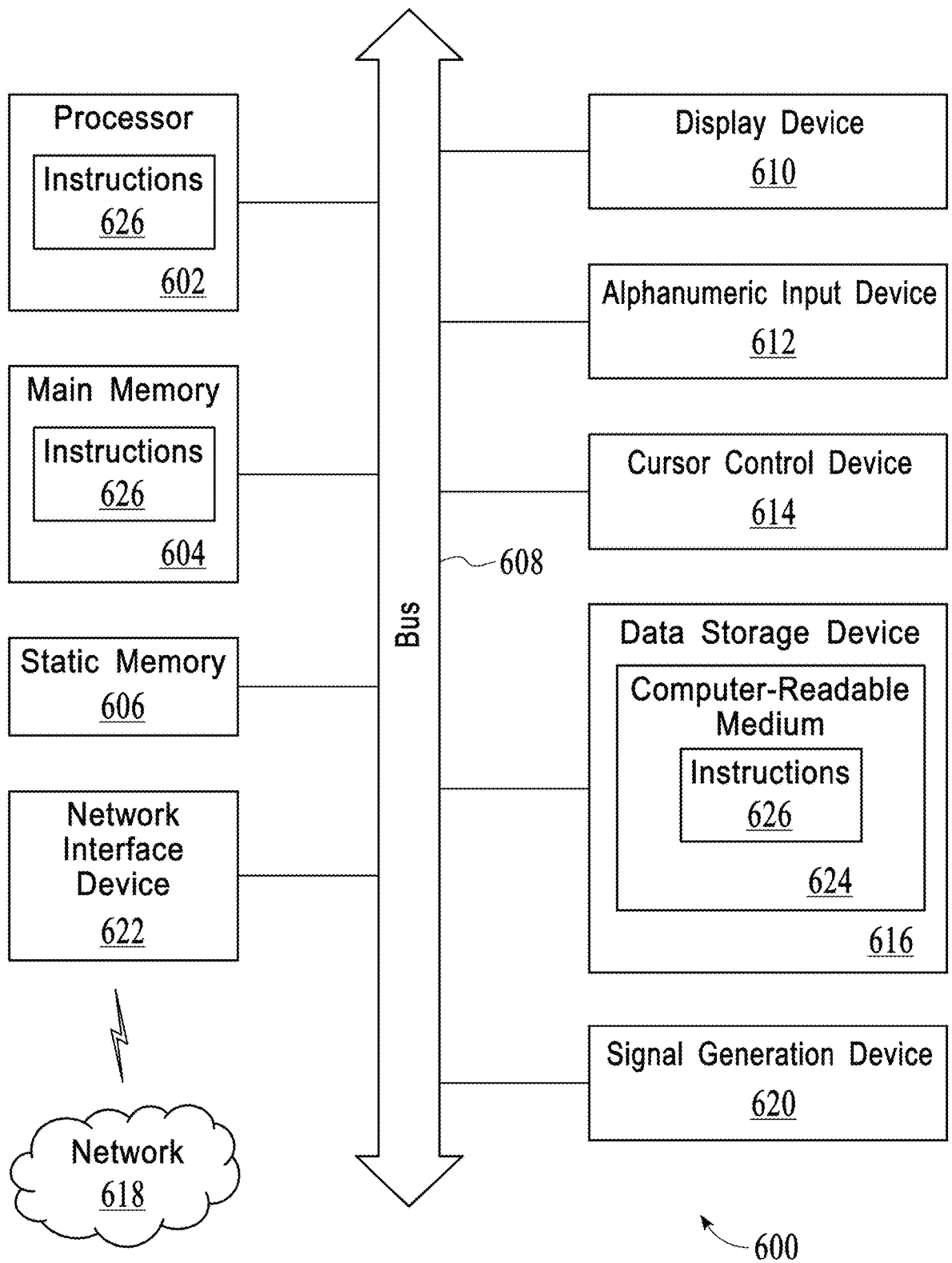
FIG. 6 illustrates an example machine of a computer system within which a set of instructions, for causing the machine to perform any one or more of the methodologies discussed herein, may be executed.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) etc.), a static memory 606 (e.g., flash memory, static random access memory (SRAM), etc.), and a data storage device 616, which communicate with each other via a bus 608.

Processing device 602 represents one or more general-purpose processing devices such as a microprocessor, a central processing unit, or the like. More particularly, the processing device may be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 is configured to execute instructions for performing the operations and steps discussed herein.

The computer system 600 may further include a network interface device 622 to communicate over the network 618. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse or a touch pad,), a signal generation device 620 (e.g., a speaker), a graphics processing unit (not shown), video processing unit (not shown), and audio processing unit (not shown).

The data storage device 616 may include a machine-readable storage medium 624 (also known as a computer-readable medium) on which is stored one or more sets of instructions or software embodying any one or more of the methodologies or functions described herein. The instructions may also reside, completely or at least partially, within the main memory 604 and/or within the processing device 602 during execution thereof by the computer system 600, the main memory 604 and the processing device 602 also constituting machine-readable storage media.

In one implementation, the instructions include instructions to implement functionality corresponding to a height difference determination. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "obtaining" or "associating" or "executing" or "generating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A method comprising:
    selecting an area of a semiconductor device to be scanned by a scanning electron microscope (SEM), wherein the area includes a three-dimensional (3D) feature having a depth;
    obtaining a plurality of energy filter values using a model that simulates potential distribution within the 3D feature when an electron beam of the SEM is to impinge on the selected area including the 3D feature, wherein the model expresses value of local potential as a function of coordinates of a location of emittance of secondary electrons as offset from a reference value;
    extracting from the model, prior to performing actual imaging of the selected area of the semiconductor device, a correspondence between the plurality of energy filter values and respective depths of the 3D feature along a longitudinal direction by analyzing the simulated potential distribution;
    pre-charging the selected area to create a potential difference between a top and a bottom surface of the 3D feature at a first imaging setting;
    obtaining, at a second imaging setting, a plurality of SEM images of the 3D feature corresponding to the plurality of energy filter values;
    associating the plurality of SEM images with their respective depths at the second imaging setting based on the extracted correspondence between the plurality of energy filter values and the respective depths at the first imaging setting that is extracted from the model; and
    generating a 3D profile of the 3D feature from the plurality of SEM images obtained from various depths of the 3D feature.

2. The method of claim 1, wherein the method is integrated in-line with other processing steps in a manufacturing sequence of a wafer containing the semiconductor device.

3. The method of claim 1, wherein the 3D feature has a high, medium or low aspect ratio having a lateral dimension in a range varying from a few nanometers to tens or hundreds of nanometers.

4. The method of claim 1, wherein the method of pre-charging the selected area before obtaining the plurality of SEM images further comprises: adjusting pre-charging parameters of the selected area based on a conductivity of the 3D feature, such that a potential difference exists between the top surface and the bottom surface of the 3D feature.

5. The method of claim 4, wherein the potential difference between the top surface and the bottom surface of the 3D feature is expressed as: $V=\varphi(x,y,z_1)-\varphi(x,y,0)$, where a depth of the 3D feature is $z_1$ along a longitudinal direction 'z', and 'x' and 'y' are lateral coordinates parallel to a plane of a wafer containing the semiconductor device.

6. The method of claim 1, wherein the model can be configured to further extract correspondence between secondary electron energy and one or more of the following characteristics of the 3D feature: critical dimension at a certain depth, taper, tilt, notch, ellipticity, line edge roughness (LER), line width roughness (LWR).

7. The method of claim 1, wherein the model can be configured to extract correspondence between secondary electron energy and one or more characteristics of the 3D feature across a full wafer.

8. The method of claim 1, wherein simulating the potential distribution comprises:
    assuming a potential distribution along the longitudinal direction;
    simulating a first set of waveforms corresponding to the potential distribution that is assumed;
    simulating a second set of waveforms corresponding to a set of measured energy filter values;
    altering the first set of waveforms to respectively match with the second set of waveforms; and
    recalculating the potential distribution based on the altered first set of waveforms.

9. The method of claim 8, wherein the method further comprises:
    extracting depth values from the measured energy filter values.

10. The method of claim 9, wherein the extracted depth values are associated respectively with the plurality of SEM images.

11. The method of claim 10, wherein the 3D profile is obtained by combining the plurality of SEM images at the respective depth values.

12. The method of claim 1, wherein a frame registration algorithm is applied to the plurality of SEM images.

13. The method of claim 12, wherein the frame registration algorithm is based on an inherent symmetry in the 3D feature.

14. A non-transitory machine-readable storage medium storing instructions which, when executed, cause a processing device to perform operations comprising:

selecting an area of a semiconductor device to be scanned by a scanning electron microscope (SEM), wherein the area includes a three-dimensional (3D) feature having a depth;

obtaining a plurality of energy filter values using a model that simulates potential distribution within the 3D feature when an electron beam of the SEM is to impinge on the selected area including the 3D feature, wherein the model expresses value of local potential as a function of coordinates of a location of emittance of secondary electrons as offset from a reference value;

extracting from the model, prior to performing actual imaging of the selected area of the semiconductor device, a correspondence between the plurality of energy filter values and respective depths of the 3D feature along a longitudinal direction by analyzing the simulated potential distribution;

pre-charging the selected area to create a potential difference between a top and a bottom surface of the 3D feature at a first imaging setting;

obtaining, at a second imaging setting, a plurality of SEM images of the 3D feature corresponding to the plurality of energy filter values;

associating the plurality of SEM images with their respective depths at the second imaging setting based on the correspondence between the plurality of energy filter values and the respective depths at the first imaging setting that is extracted from the model; and generating a 3D profile of the 3D feature from the plurality of SEM images obtained from various depths of the 3D feature.

15. The non-transitory machine-readable storage medium of claim 14, wherein simulating the potential distribution further comprises:

assuming a potential distribution along the longitudinal direction;

simulating a first set of waveforms corresponding to the potential distribution that is assumed;

simulating a second set of waveforms corresponding to a set of measured energy filter values;

altering the first set of waveforms to respectively match with the second set of waveforms; and recalculating the potential distribution based on the altered first set of waveforms.

16. The non-transitory machine-readable storage medium of claim 15, wherein the operation further comprises: extracting depth values from the measured energy filter values.

17. The non-transitory machine-readable storage medium of claim 16, wherein the extracted depth values are associated respectively with the plurality of SEM images.

18. The non-transitory machine-readable storage medium of claim 17, wherein the 3D profile is obtained by combining the plurality of SEM images at the respective depth values.

19. The non-transitory machine-readable storage medium of claim 14, wherein a frame registration algorithm is applied to the plurality of SEM images.

20. The non-transitory machine-readable storage medium of claim 19, wherein the frame registration algorithm is based on an inherent symmetry in the 3D feature.

* * * * *